United States Patent [19]

Knack, Jr.

[11] 4,272,148

[45] Jun. 9, 1981

[54] SHIELDED CONNECTOR HOUSING FOR USE WITH A MULTICONDUCTOR SHIELDED CABLE

[75] Inventor: Albert C. Knack, Jr., Santa Rosa, Calif.

[73] Assignee: Hewlett-Packard Company, Palo Alto, Calif.

[21] Appl. No.: 27,204

[22] Filed: Apr. 5, 1979

[51] Int. Cl.[3] .......................... H01R 13/58; H05K 9/00

[52] U.S. Cl. ............................ 339/143 R; 339/103 R; 339/141; 339/177 E

[58] Field of Search ............................ 174/88 C, 88 S; 339/143 R, 143 S, 177 R, 177 E, 136 R, 136 A, 141, 103 B, 107

[56] References Cited

U.S. PATENT DOCUMENTS

| | | | |
|---|---|---|---|
| 3,291,895 | 12/1966 | Van Dyke | 339/177 R X |
| 3,659,251 | 4/1972 | Fish | 339/143 R |
| 3,999,830 | 12/1976 | Herrmann et al. | 339/141 X |
| 4,018,979 | 4/1977 | Young | 339/143 R X |

*Primary Examiner*—Eugene F. Desmond
*Attorney, Agent, or Firm*—Patrick J. Barrett

[57] ABSTRACT

A shielded housing for a connector connected to a multiconductor shielded cable comprises two mating shells and a ferrule. The ferrule is placed around the cable and the shielding braid wires are folded back over the ferrule. The shells clamp around the ferrule to make good electrical contact with the cable shield and also to provide strain relief for the cable.

8 Claims, 10 Drawing Figures

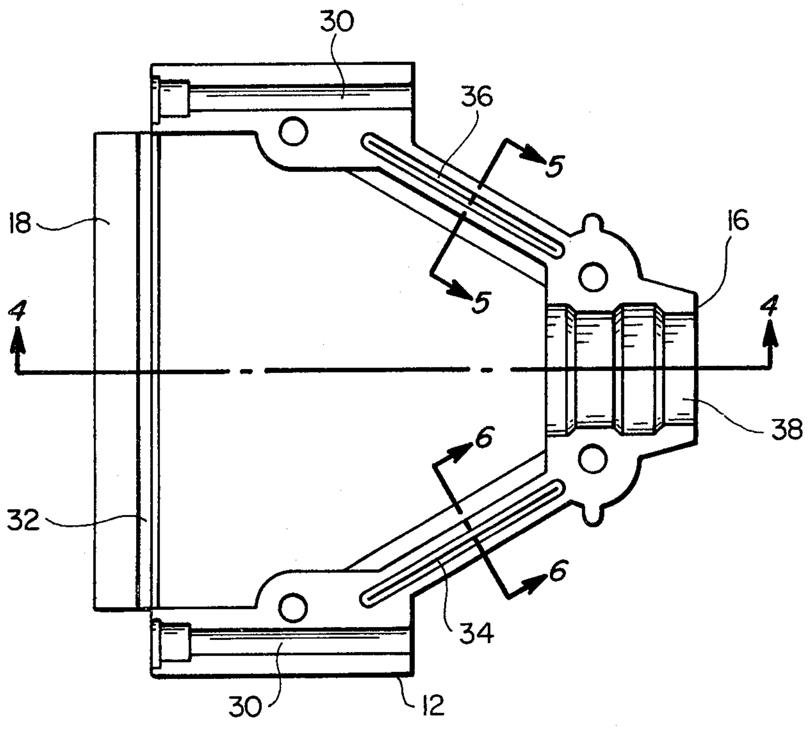
FIG_3
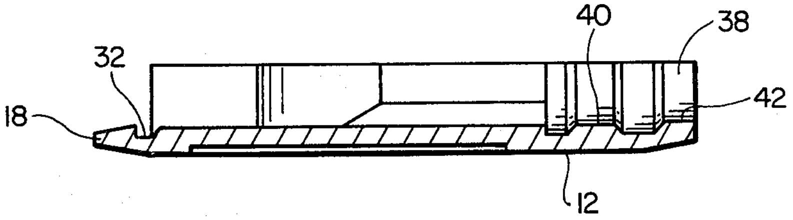
FIG_4
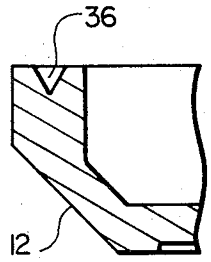
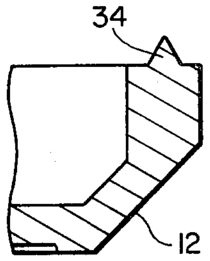
FIG_5
FIG_6

SHIELDED CONNECTOR HOUSING FOR USE WITH A MULTICONDUCTOR SHIELDED CABLE

BACKGROUND OF THE INVENTION

1. Field of the Invention

This invention relates to shielded electrical connectors for use with multiconductor shielded electrical cables.

2. Description of the Prior Art

Multiconductor cables used to interconnect electronic equipment must frequently be shielded against electromagnetic interference. Cables carrying digital signals, between a computer and a piece of equipment under computer control, for example, often radiate undesirable signals that can interfere with other equipment as well as radio communications. This radiation can be reduced significantly by covering the cable with a braided wire shield which is grounded to the enclosures of the pieces of equipment to which the cable is connected. Similarly, cables interconnecting some electronic instruments can act as antennas that pick up unwanted electromagnetic signals, and shielded cables are used to protect against such unwanted interference.

Multipin plugs are usually attached at each end of a multiconductor cable and mate with multipin receptacles on the electronic equipment. In order for the shielding against electromagnetic interference to be complete, it is usually necessary to enclose the connectors and the end portions of the cables in a shielded connector housing. These prior art connector housings usually comprise a large number of components and require a relatively large amount of time to attach to a cable and connector. In some of these prior art housings, the cable shield must be soldered to a portion of the connector housing and portions of the housing may also be soldered together to provide a complete shield, making the assembly difficult to repair later on.

Another feature provided by many prior art connector housings is strain relief for the cable where it enters the housing. Often strain relief is provided by a complex collar and clamp mechanism attached to the housing. One disadvantage of some commonly available clamps is that they tend to squash the cable rather than clamping it uniformly about its periphery.

SUMMARY OF THE INVENTION

In accordance with the preferred embodiment of the present invention, a shielded connector housing for use with a multiconductor shielded cable comprises two mating shells and a ferrule. The mating shells each have a lip with a groove for holding and making electrical contact with the connector body. The ferrule fits over the outer jacket of the cable and a portion of the cable shield braid is folded back over the ferrule. Each shell has a curved recess with ridges in it for engaging and retaining the ferrule. When the shells are fastened together, they compress the ferrule around the cable and tightly clamp the shield braid between the outer surface of the ferrule and one of the ridges in the semicircular recess.

The assembled connector housing provides an effective shield against electromagnetic radiation by making good electrical contact with the body of the connector and with the cable shield. The ferrule not only provides a means for connecting with the cable shield, but also provides strain relief for the cable without squashing the cable as was done in prior art strain relief devices. The simplicity of the preferred embodiment and the ease of assembling it make it much less expensive than prior art devices. Since no part of the connector housing has to be soldered to other parts, to the cable or connector, it is much easier to make repairs to the assembly later on.

DESCRIPTION OF THE DRAWINGS

FIG. 3 shows a top view of a connector housing shell.

FIGS. 4, 5 and 6 show sectional views of FIG. 3.

DESCRIPTION OF THE PREFERRED EMBODIMENT

Figure 1:
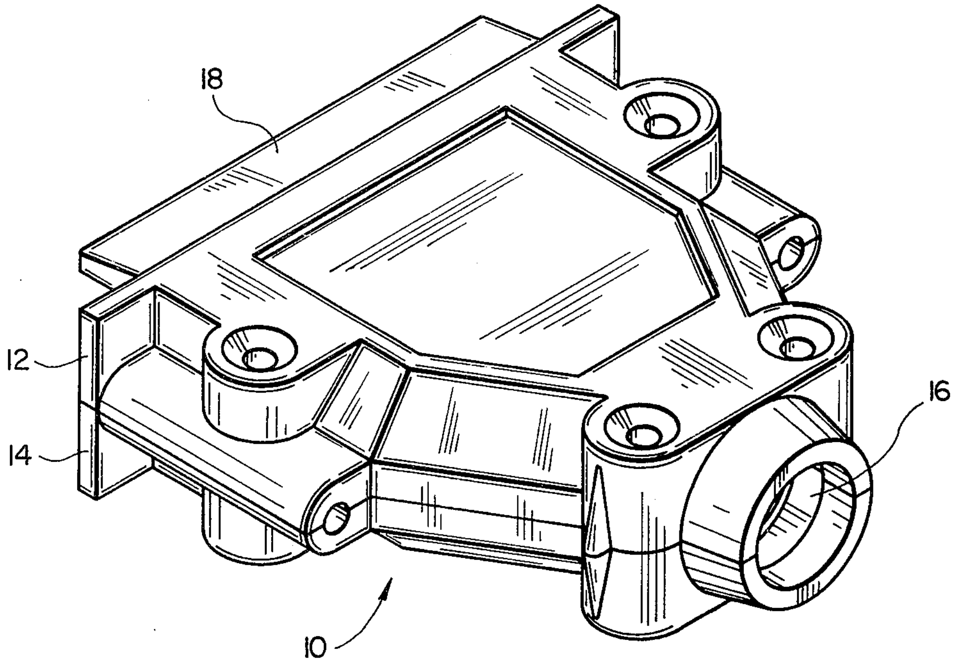
FIG. 1 shows a perspective view of the preferred embodiment of the present invention.

FIG. 1 shows a perspective view of a shielded connector housing 10 comprising mating upper and lower shells 12 and 14. Housing 10 has an opening 16 in one end for an electrical cable and a retaining lip 18 in another end for a connector.

Figure 2:
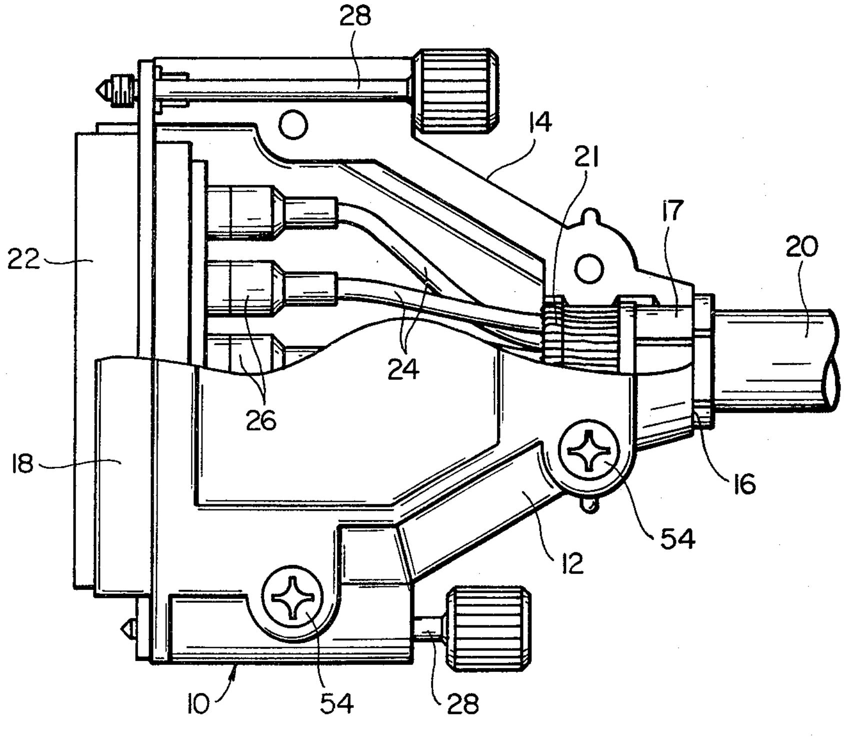
FIG. 2 shows a partially cut away view of a connector housing shielding the connection between a multiconductor cable and a connector.

FIG. 2 shows a partially cut away top view of housing 10 with a cable 20 entering the housing through opening 16 and a connector 22 held by retaining lip 18. Cable 20 has a number of individually insulated conductors 24 which are connected to connector pins 26 in connector 20. A ferrule 17 surrounds cable 20 in opening 16, securely clamping the cable and providing strain relief and a means of connection to a shielding braid 21 inside the cable, as will be described in further detail below. Screws 28, retained in holes provided in housing 10, are used to mount connector 22 to a mating receptacle or connector (not shown).

The upper and lower shells of the preferred embodiment are identical, therefore only one of the shells will be described in detail. FIG. 3 shows the inside of shell 12, and FIGS. 4, 5 and 6 shows various sectional views of shell 12 as indicated in FIG. 3. Shell 12 has longitudinal semicylindrical slots 30 along either side which form one half of the holes for retaining screws 28. Retaining lip 18 has a groove 32 for engaging a flange on connector 22 to retain the connector as well as to provide an electrical seal against leakage of electromagnetic radiation.

A seal against electromagnetic radiation is also provided by rib 34 and groove 36 along the sides of shell 12. The rib and groove mate with a matching groove and rib on shell 14 when the two parts are mated together to form housing 10. A curved recess 38 in one end of shell 12 forms one half of opening 16 and has ridges 40 and 42 for engaging ferrule 17.

Figure 7:
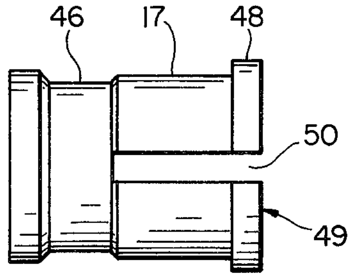
FIG. 7 shows a side view of a ferrule.
Figure 8:
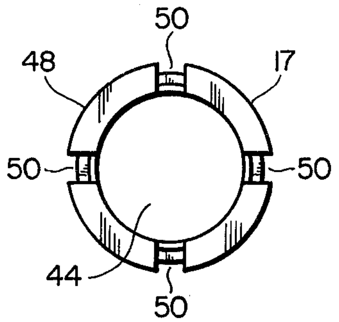
FIG. 8 shows an end view of a ferrule.

A side view of ferrule 17 is shown in FIG. 7 and an end view, in FIG. 8. There is a hole 44 through ferrule 17 which is approximately the same diameter as the outside diameter of cable 20. The outer surface of ferrule 17 has a recess 46 for mating with ridge 40 in opening 16 and a boss 48 on an end 49 abutting one end of shell 12. Longitudinal slots 50 are also cut in the same end of ferrule 17.

Figure 9:
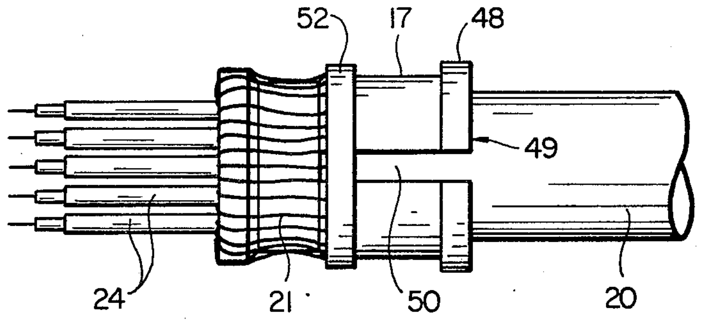
FIG. 9 shows a ferrule assembled on the end of a multiconductor shielded cable.

To assemble the cable and connector in housing 10, ferrule 17 is slipped over cable 20 and a portion of each of the insulated conductors 24 is exposed to permit connection to connector 22. Also, a portion of shield 21, which is typically braided wire, is exposed, unbraided and folded back over ferrule 17 as shown in FIG. 9. A piece of insulating tape 52 may be placed over the ends of the shield wires to hold them in place during assembly. After conductors 24 are connected to the appropriate pins on connector 22, connector 22 is located in recess 32 in shells 12 and 14 while ferrule 17 is located in recess 38. The shells are fastened together by four screws 54.

When screws 54 are tightened to clamp shells 12 and 14 together, ridges 40 are forced into intimate contact with shield 21 to make a good electrical connection between the shield and the housing. At the same time, ridge 42 compresses end 49 of ferrule 17, securely clamping cable 20 to prevent it from slipping or rotating in housing 10.

Figure 10:
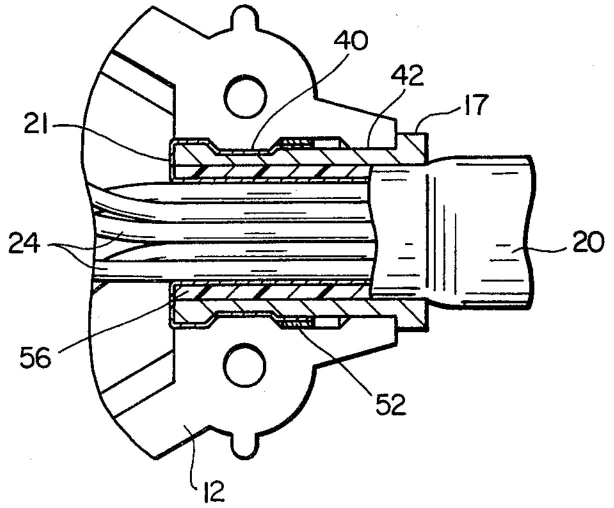
FIG. 10 shows a partial sectional view of the apparatus of FIG. 2.

FIG. 10 shows a cross-sectional view through the rear portion of an assembled housing where the section is taken along the part line between shells 12 and 14. Cable 20, covered by an insulating sheath 56, passes through hole 44 in ferrule 17 and sheath 56 stops inside ferrule 17 to allow shield 21 to be unbraided and folded over the ferrule. As mentioned above, slots 50 allow end 49 of ferrule 17 to be compressed slightly in order to engage or grasp cable 20. Since sheath 56 is usually a soft plastic, it will deform and flow into slots 50, helping to prevent rotation of the cable. Compression of ferrule 17 around the body of the cable also helps provide strain relief for the connections between conductors 24 and the connector pins, since the cable is held against longitudinal movement in the ferrule. The ferrule, in turn, is held against movement by ridges 40 and 42 in cooperation with groove 46 and boss 48.

Thus it can be seen that housing 10 provides a complete electromagnetic shield around the connection between cable 20 and connector 22 with just three pieces: shells 12 and 14 are ferrule 17. In addition, the connection is protected from physical damage, the user is protected from possible shock danger through contact with any exposed connections between conductors 24 and connector 22, and axial and tortional strain relief is provided for the cable.

I claim:

1. A shielded housing for a connector attached to a cable having one or more insulated conductors in a common conductive shield covered by an insulative plastic sheath, the housing comprising:
   - a generally cylindrical ferrule for surrounding a portion of the insulative plastic sheath on the end of the cable attached to the connector and having a plurality of longitudinal slots that allow the ferrule to be compressed and engage the sheath; and
   - mating first and second shells, each shell having connector retaining means for retaining and making electrical contact with the connector, and a cable recess for retaining the cable by compressing the ferrule sufficiently to deform the sheath and cause some of the sheath material to flow into the slots and making electrical contact with the conductive shield by clamping the shield between the outer surface of the ferrule and the cable recess when the first and second shells are mated together.

2. A shielded housing as in claim 1 wherein the ferrule has a groove in its outer surface and the cable recesses have ridges for mating with the groove in the ferrule.

3. A shielded housing as in claim 2 wherein the connector retaining means comprises a lip with a groove therein on each shell and the shells have interlocking ridges and grooves for aligning the shells and providing a seal against electromagnetic radiation leakage.

4. A connector assembly for a multiconductor shielded cable covered by a plastic sheath comprising:
   - a connector connected to conductors in the cable;
   - a generally cylindrical ferrule surrounding a portion of the cable, having a plurality of longitudinal slots along a portion of its length and having an outer surface over which a portion of the shield is placed;
   - a housing comprising two mating shells having connector retaining means for retaining the connector and having recesses that form cable retaining means for engaging the ferrule and the portion of the shield placed over the ferrule and for clamping the ferrule to the cable to compress the ferrule around a portion of an outer surface of the cable to deform the plastic sheath and cause some of the plastic sheath material to flow into the slots for preventing rotation of the cable.

5. A connector assembly as in claim 4 wherein the outer surface of the ferrule includes a groove over which a portion of the shield is placed and the recess in each shell includes a ridge that mates with the groove in the ferrule to make electrical contact with the shield.

6. A connector assembly as in claim 5 wherein the first and second shells are identical and have mating ribs and recesses about their peripheries.

7. A connector assembly as in claim 6 wherein the cable shield is a wire braid and the portion of the shield placed over the outer surface of the ferrule comprises unbraided wires.

8. A connector assembly as in claim 7 wherein the connector has a flange and the connector retaining means includes a recess in each shell for engaging the flange.

* * * * *

UNITED STATES PATENT AND TRADEMARK OFFICE

CERTIFICATE OF CORRECTION

PATENT NO. : 4,272,148

DATED : June 9, 1981

INVENTOR(S) : Albert C. Knack, Jr.

It is certified that error appears in the above-identified patent and that said Letters Patent are hereby corrected as shown below:

Column 2, line 36, "connector 20" should read -- connector 22 --; line 46, "shows" should read -- show --.

Signed and Sealed this

*Twenty-second* Day of *September 1981*

[SEAL]

*Attest:*

GERALD J. MOSSINGHOFF

*Attesting Officer* *Commissioner of Patents and Trademarks*